US009277671B2

(12) United States Patent
Tsai

(10) Patent No.: US 9,277,671 B2
(45) Date of Patent: Mar. 1, 2016

(54) ELECTRONIC APPARATUS

(71) Applicant: KABUSHIKI KAISHA TOSHIBA, Minato-ku, Tokyo (JP)

(72) Inventor: Brian Tsai, Taipei (TW)

(73) Assignee: Kabushiki Kaisha Toshiba, Tokyo (JP)

( * ) Notice: Subject to any disclaimer, the term of this patent is extended or adjusted under 35 U.S.C. 154(b) by 422 days.

(21) Appl. No.: 14/010,922

(22) Filed: Aug. 27, 2013

(65) Prior Publication Data

US 2014/0211380 A1 Jul. 31, 2014

Related U.S. Application Data

(63) Continuation of application No. PCT/JP2013/058626, filed on Mar. 25, 2013.

(30) Foreign Application Priority Data

Jan. 31, 2013 (JP) .................................. 2013-017806

(51) Int. Cl.
*H05K 7/16* (2006.01)
*G06F 1/16* (2006.01)

(52) U.S. Cl.
CPC *H05K 7/16* (2013.01); *G06F 1/162* (2013.01); *G06F 1/1681* (2013.01)

(58) Field of Classification Search
USPC .................................................... 361/679.01
IPC ....................................................... H05K 7/16
See application file for complete search history.

(56) References Cited

U.S. PATENT DOCUMENTS

| 6,230,509 B1 * | 5/2001 | Yamamoto | H05K 7/16 165/137 |
| 2009/0144934 A1 | 6/2009 | Kitagawa et al. | |
| 2012/0262857 A1 * | 10/2012 | Fukaya | H04M 1/0216 361/679.01 |

(Continued)

FOREIGN PATENT DOCUMENTS

| JP | 02-235125 A | 9/1990 |
| JP | 2007-267238 A | 10/2007 |

(Continued)

OTHER PUBLICATIONS

An English Translation of the International Search Report mailed by Japan Patent Office on May 7, 2013 in corresponding PCT application No. PCT/JP2013/058626) and Notification (PCT/IB/311)—2 pages.

(Continued)

*Primary Examiner* — David Warren
(74) *Attorney, Agent, or Firm* — Knobbe, Martens Olson & Bear LLP

(57) ABSTRACT

According to one embodiment, an electronic apparatus includes a first unit, a second unit, a shaft, a first engaging portion, a moving portion, a second engaging portion, a first magnet, a second magnet, and a metal member. The second engaging portion is movable in a vicinity of the moving portion and configured to restrict a movement of the moving portion when the second engaging portion is engaged with the first engaging portion. The second magnet is configured to act repulsively against the first magnet. The metal member is configured to release engagement between the first engaging portion and the second engaging portion by attracting the second engaging portion when the metal member is inserted between the first magnet and the second magnet.

7 Claims, 17 Drawing Sheets

(56) References Cited

U.S. PATENT DOCUMENTS

| | | | | |
|---|---|---|---|---|
| 2012/0300381 A1* | 11/2012 | Hung | ................... | G06F 1/1632 361/679.09 |
| 2014/0043737 A1* | 2/2014 | Chen | ................... | H05K 5/0226 361/679.01 |
| 2014/0211380 A1* | 7/2014 | Tsai | ................... | G06F 1/1681 361/679.01 |

FOREIGN PATENT DOCUMENTS

| | | |
|---|---|---|
| JP | 2008-113067 A | 5/2008 |
| JP | 2009-145927 A | 7/2009 |
| JP | 2010-282452 A | 12/2010 |
| JP | 2011-164819 A | 8/2011 |
| WO | WO 2014/119016 | 8/2014 |

OTHER PUBLICATIONS

International Search Report mailed by Japan Patent Office on May 7, 2013 in the corresponding PCT application No. PCT/JP2013/058626.

An English translation of IPRP mailed by Japan Patent Office on May 7, 2013 in the corresponding PCT Application No. PCT/JP2013/058626—7 pages.

* cited by examiner

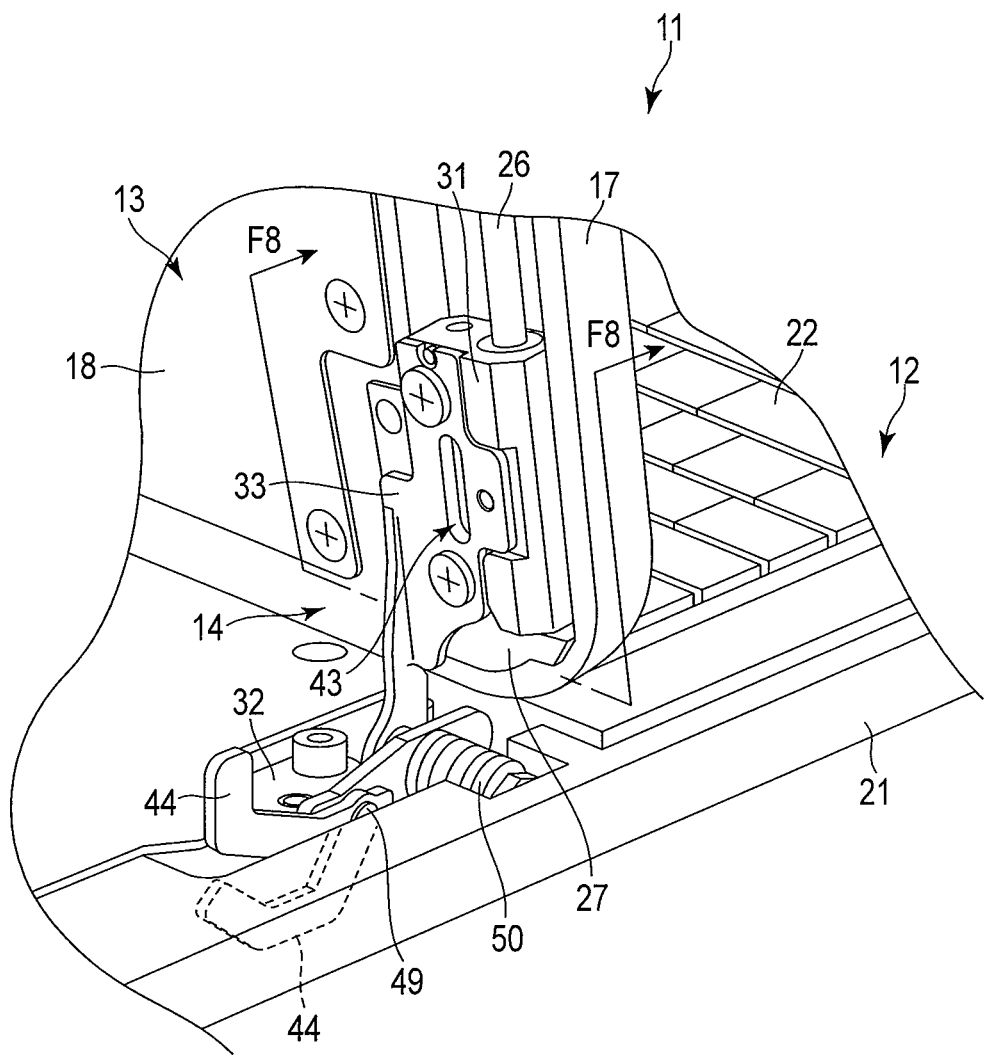
F I G. 4

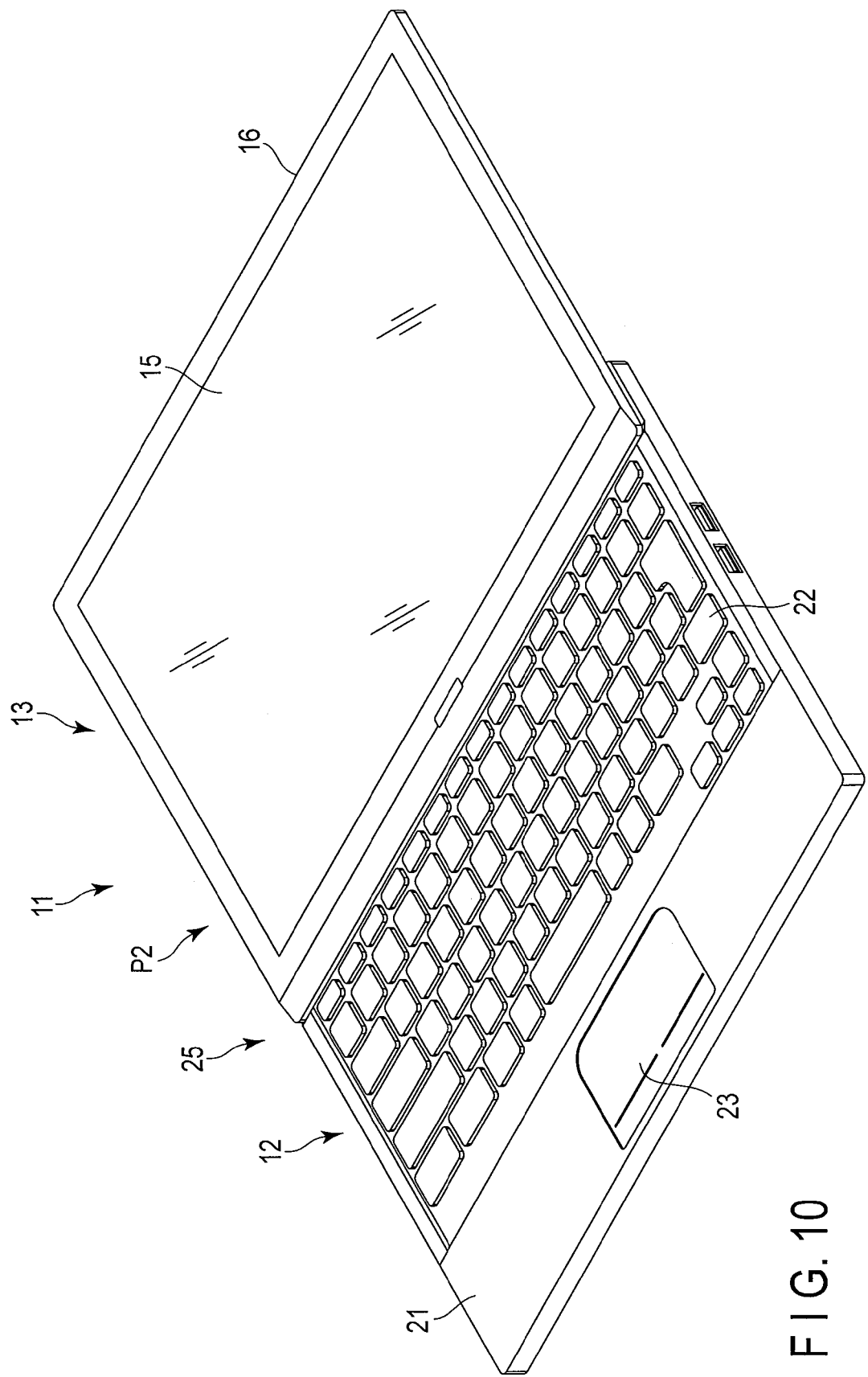
F I G. 10

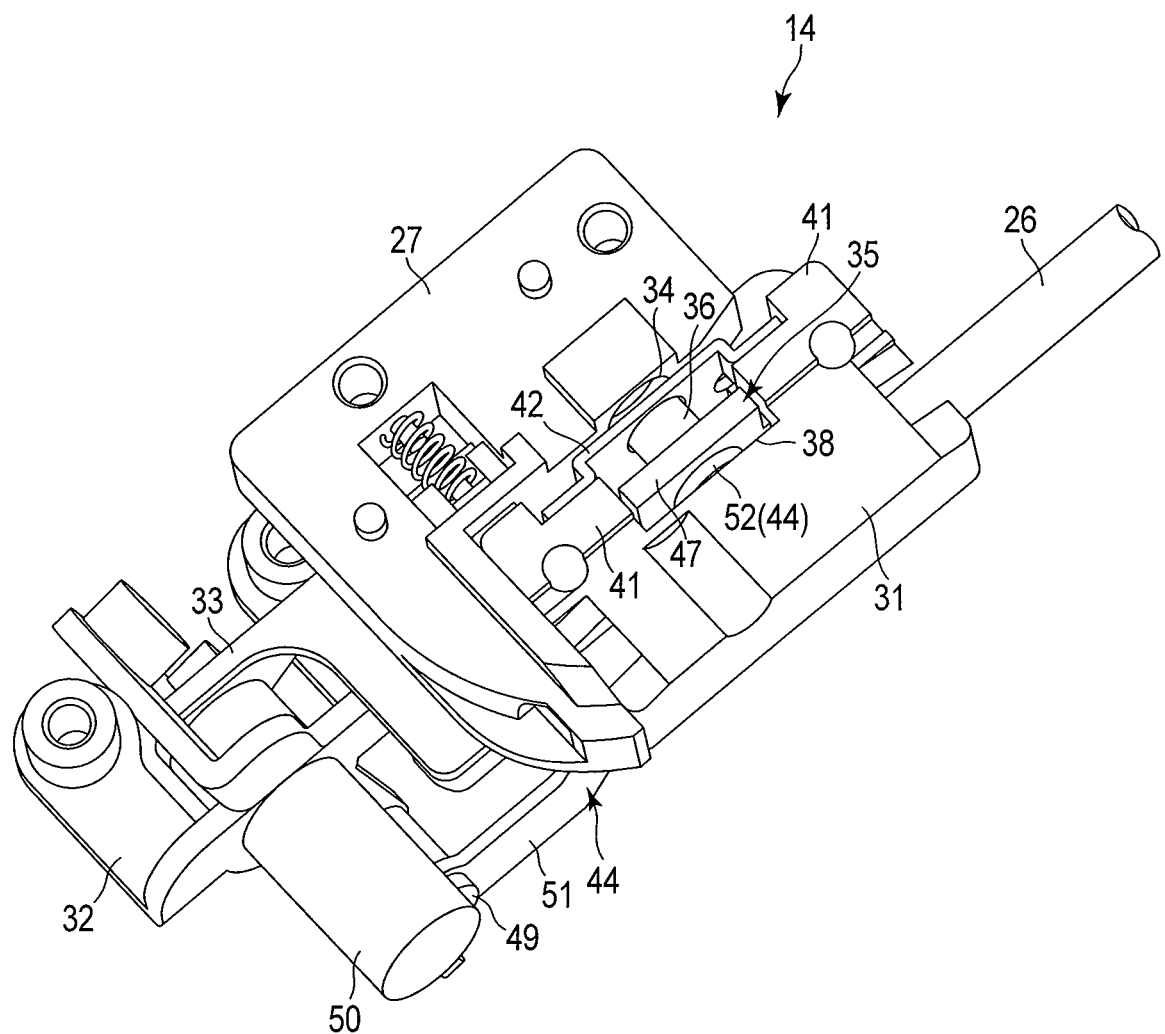
F I G. 11

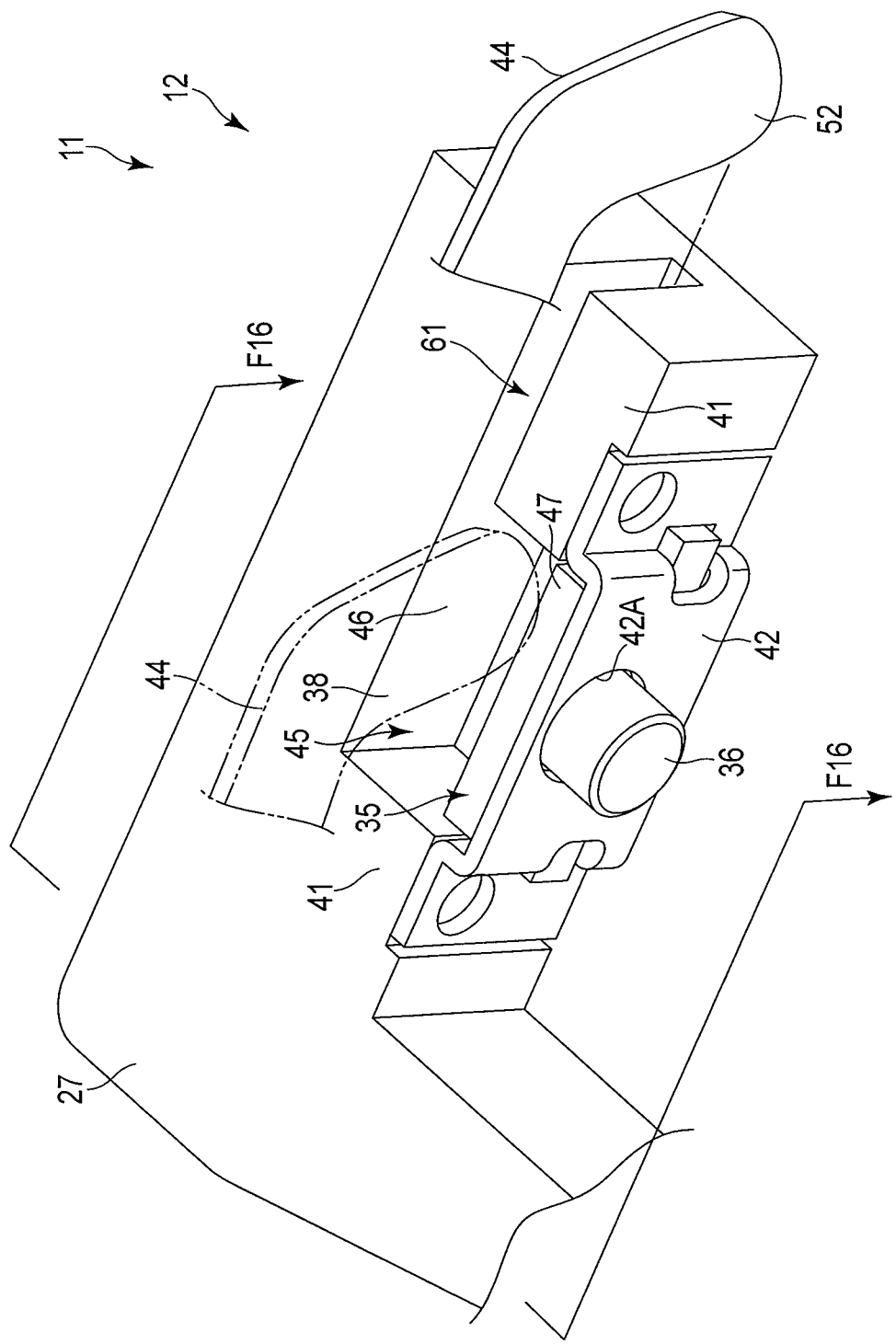
F I G. 15

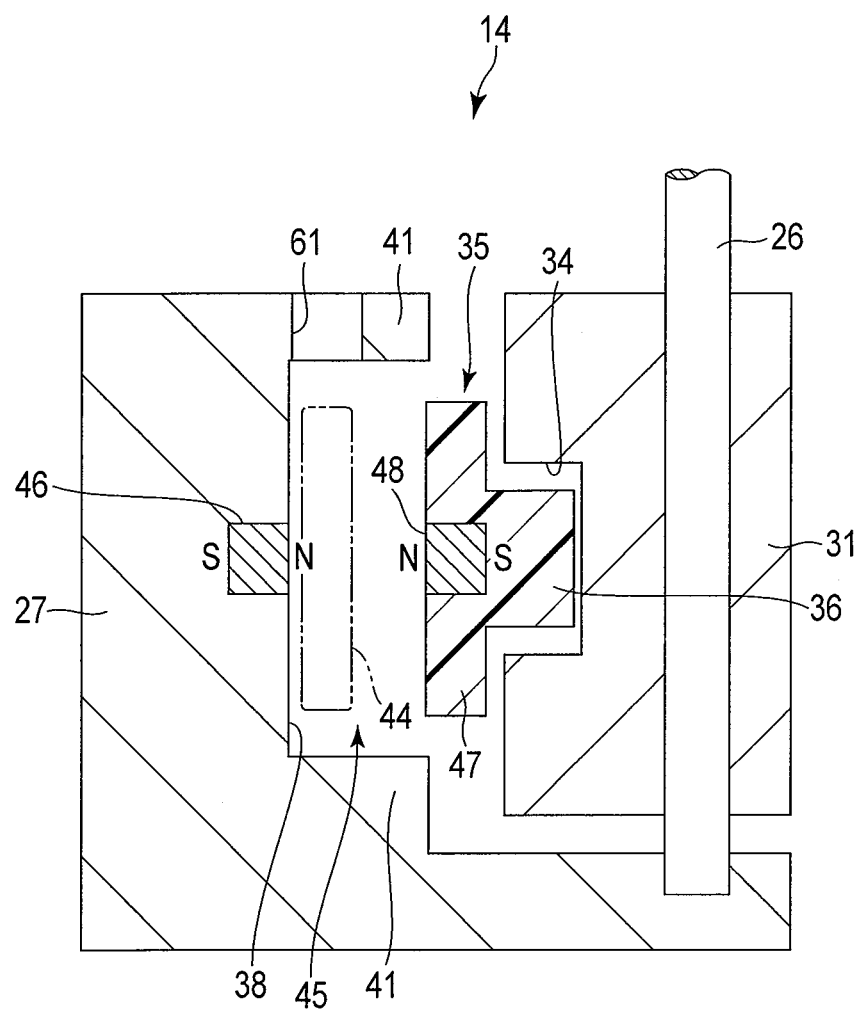
F I G. 16

ELECTRONIC APPARATUS

CROSS REFERENCE TO RELATED APPLICATIONS

This application is a Continuation application of PCT Application No. PCT/JP2013/058626, filed Mar. 25, 2013 and based upon and claiming the benefit of priority from Japanese Patent Application No. 2013-017806, filed Jan. 31, 2013, the entire contents of all of which are incorporated herein by reference.

FIELD

Embodiments described herein relate generally to electronic apparatuses including a plurality of units.

BACKGROUND

For example, notebook type personal computers have been widely used. Considering convenience, such notebook type personal computers are required to have a lighter weight and to allow a display position to be changed.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 4 is an exemplary enlarged perspective view illustrating surroundings of the hinge unit in the portable computer illustrated in FIG. 1.

FIG. 10 is an exemplary perspective view illustrating a state in which the display device of the portable computer illustrated in FIG. 1 lean backward and is placed at a position along a main unit.

FIG. 11 is an exemplary perspective view illustrating the first fixing portion, the recess, the moving portion, the insertion member, and the latch released from the recess and attracted on the insertion member in the hinge unit when the portable computer is in a state illustrated in FIG. 10.

FIG. 15 is an exemplary perspective view illustrating a first fixing portion, a recess, a moving portion, a latch engaged with the recess, and an insertion member in a hinge unit of a portable computer that is an example of an electronic apparatus of a second embodiment.

FIG. 16 is an exemplary sectional view taken along line F16-F16 of FIG. 15 and a sectional view schematically illustrating the first fixing portion, the recess, the moving portion, the latch engaged with the recess, and the insertion member in the hinge unit.

DETAILED DESCRIPTION

Various embodiments will be described hereinafter with reference to the accompanying drawings.

In general, according to one embodiment, an electronic apparatus comprises a first unit, a second unit, a shaft, a first engaging portion, a moving portion, a second engaging portion, a first magnet, a second magnet, and a metal member. The second unit is movable with respect to the first unit. The shaft is attached to the second unit. The first engaging portion is attached to the second unit. The moving portion is attached to the first unit and movable along the shaft. The second engaging portion is movable in a vicinity of the moving portion and configured to restrict a movement of the moving portion when the second engaging portion is engaged with the first engaging portion. The first magnet is provided at the moving portion. The second magnet is provided at the second engaging portion. The second magnet is configured to act repulsively against the first magnet. The metal member is configured to be detachable between the first magnet and the second magnet and to release engagement between the first engaging portion and the second engaging portion by attracting the second engaging portion when the metal member is inserted between the first magnet and the second magnet.

Figure 1:
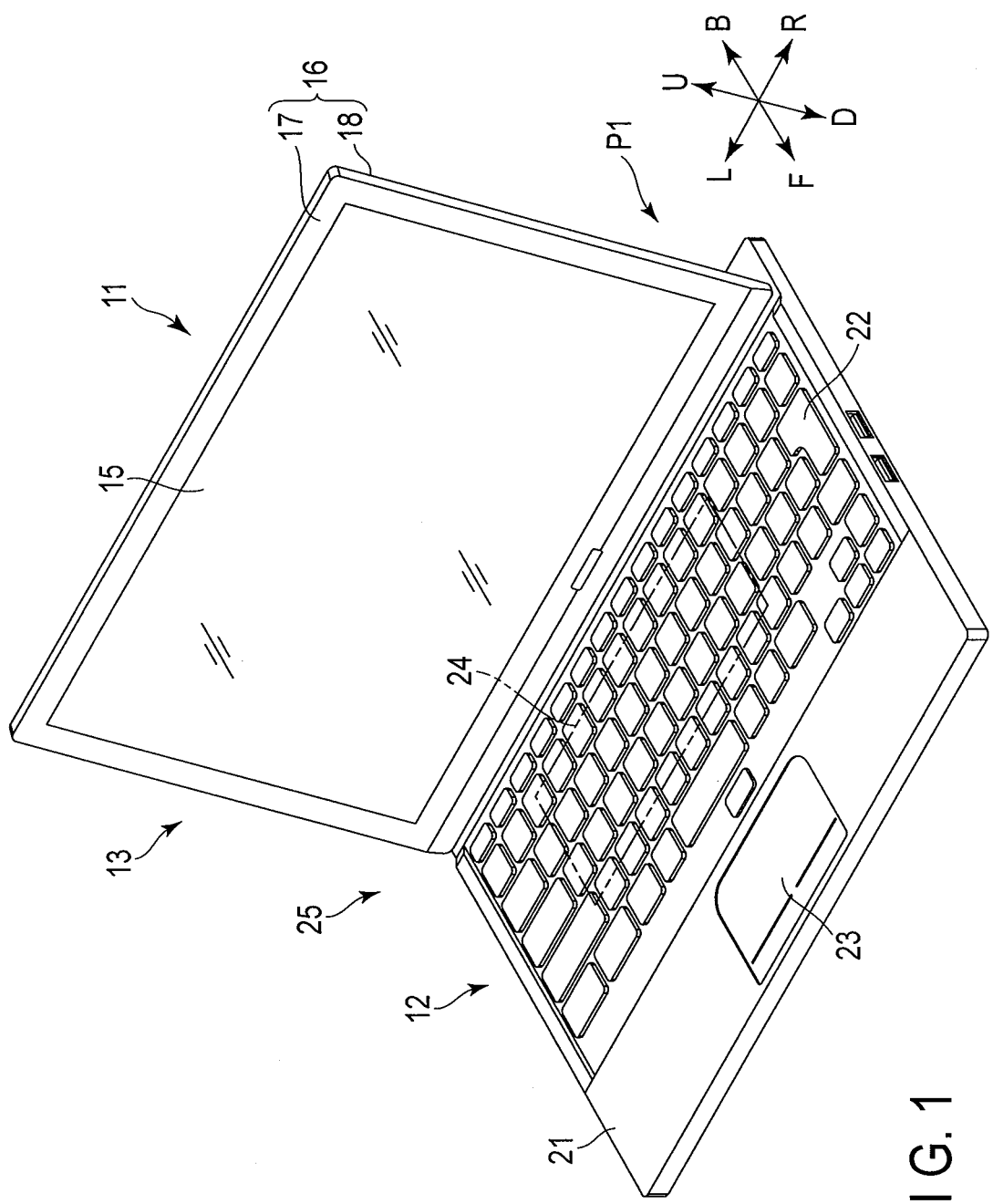
FIG. 1 is an exemplary perspective view illustrating a portable computer, which is an example of an electronic apparatus of a first embodiment.

Hereinafter, a first embodiment of an electronic apparatus will be described with reference to FIGS. 1 to 14. As illustrated in FIG. 1, in the present specification, a front side (i.e., a user side) is defined as a forward direction F; a back side viewed from a user is defined as a backward direction B; a left side viewed from the user is defined as a left direction L; a right side viewed from the user is defined as a right direction R; an upper side viewed from the user is defined as an upward direction U; and a lower side viewed from the user is defined as a downward direction D.

As illustrated in FIGS. 1 to 4, a portable computer 11, which is an example of an electronic apparatus, includes a main unit 12 as an example of a first unit, a display unit 13 as an example of a second unit, and a hinge unit 14 provided between the main unit 12 and the display unit 13 and connecting the main unit 12 and the display unit 13.

The display unit 13 includes a display panel 15, and a display cabinet 16 surrounding the display panel 15 and made of a synthetic resin. The display cabinet 16 includes a front cover 17 (e.g., mask) and a back cover 18. As an example of the display panel 15, a liquid crystal display is used in the present embodiment. The display panel 15 is not limited to the liquid crystal panel. For example, the display panel 15 may be other types of display panels, such as a plasma display panel, an organic EL, a plastic display panel, a sheet display panel, or the like. Like a main cabinet 21, the display cabinet 16 may be made of a metal material.

As illustrated in FIGS. 1 to 4, the main unit 12 includes a main cabinet 21 made of, for example, a metal material in a box shape, a keyboard 22 attached to the main cabinet 21 from an outside, and a touch pad 23 provided on a top surface of the main cabinet 21 in a more front side than the keyboard 22. The main unit 12 further includes a first printed circuit board 24 (e.g., main board) inside the main cabinet 21. A housing 25 comprises the display cabinet 16 and the main cabinet 21.

The main cabinet 21 is made of, for example, a metal material such as a magnesium alloy, but the material of the main cabinet 21 is not limited to the metal material. The material of the main cabinet 21 may be, for example, a synthetic resin, and may be other metal materials such as an aluminum alloy.

Figure 2:
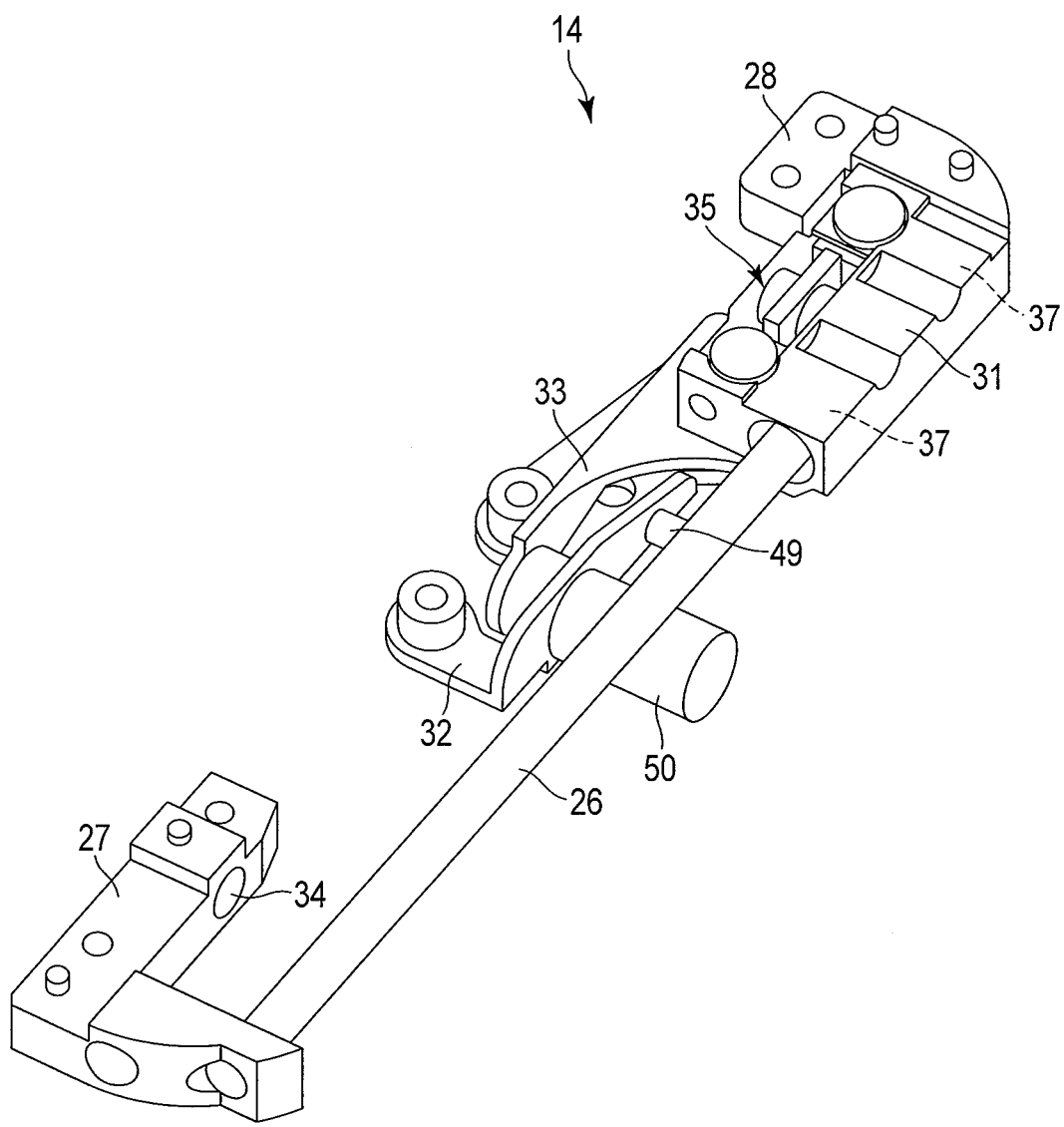
FIG. 2 is an exemplary perspective view illustrating an overall structure of a hinge unit (e.g., right side) in the portable computer illustrated in FIG. 1.
Figure 3:
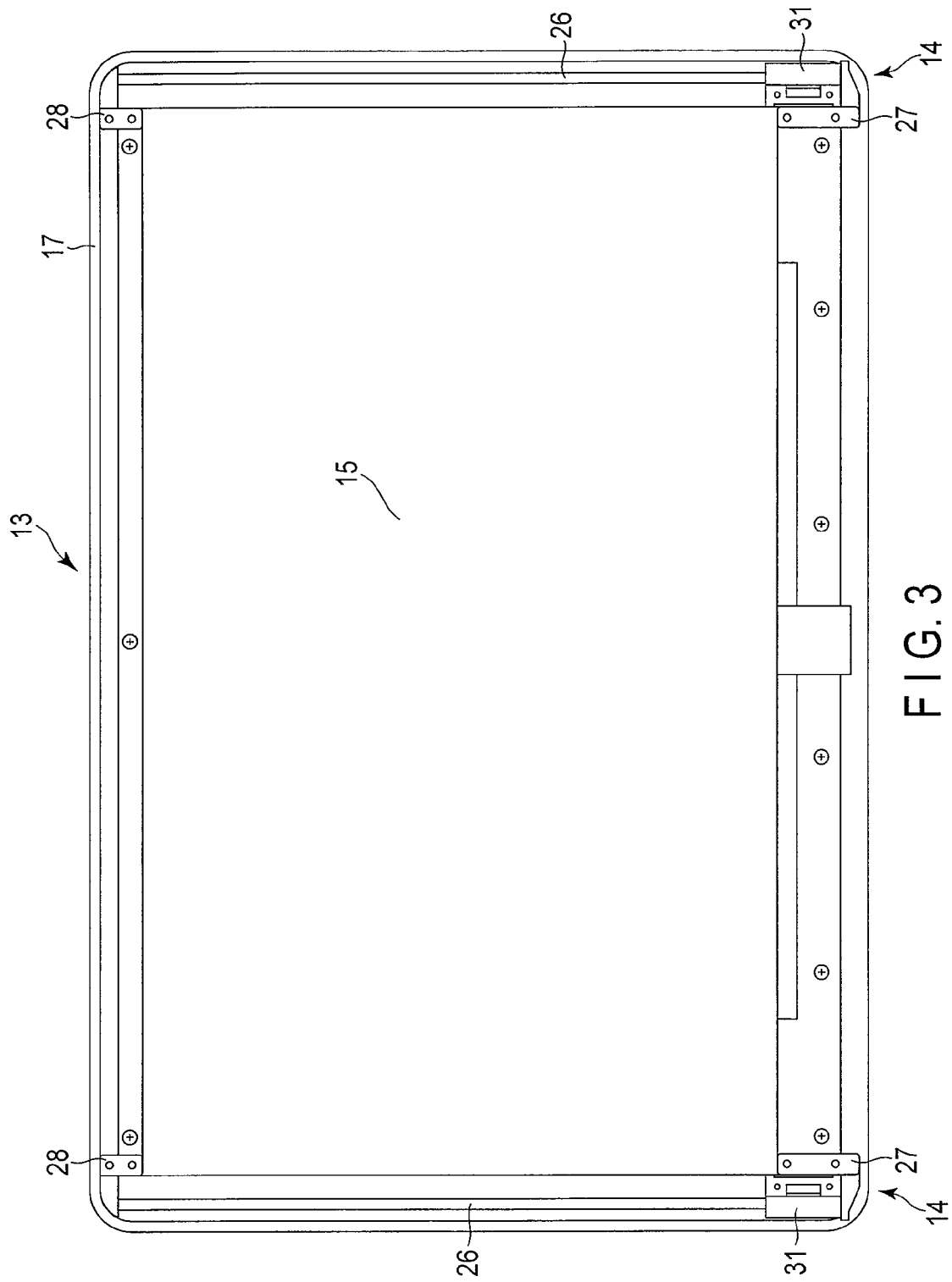
FIG. 3 is an exemplary rear view illustrating a state in which a back cover of a display unit in the portable computer illustrated in FIG. 1 is removed.
Figure 13:
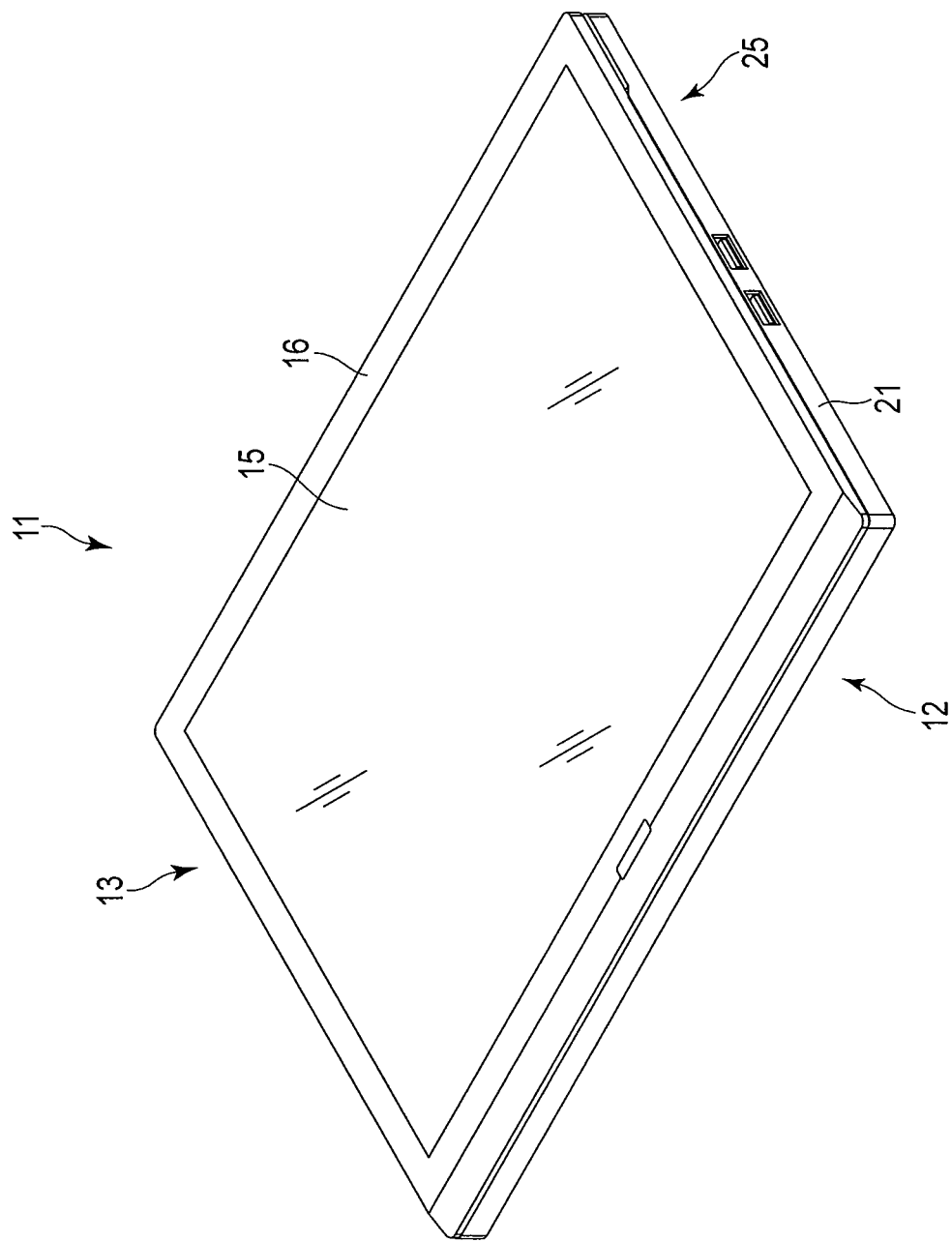
FIG. 13 is an exemplary perspective view illustrating a state (e.g., tablet form) in which the display device of the portable computer illustrated in FIG. 1 is overlapped on the main unit.

As illustrated in FIGS. 2 to 4, the hinge unit 14 rotatably supports the display unit 13 with respect to the main unit 12. The hinge unit 14 can rotate the display unit 13 between a closed state, in which the display unit 13 is overlapped on the main unit 12 such that the display panel 15 of the display unit 13 faces the keyboard 22, and an open state, in which the display unit 13 stands up with respect to the main unit 12. As illustrated in FIG. 13, the hinge unit 14 can move the display unit 13 in a so-called tablet form in which a rear side of the display panel 15 faces the keyboard 22 (i.e., a state in which the display panel 15 faces an outside).

The hinge unit 14 of the present embodiment is a sliding hinge that is partially movable and is capable of moving the display unit 13 in a sliding manner. The hinge unit 14 is configured by combining a plurality of components made of a metal or a synthetic resin.

As illustrated in FIGS. 2 to 4, the hinge unit 14 includes: a shaft 26 made of a metal (e.g., a stainless steel, an iron, or the like); a first fixing portion 27 made of a metal and attaching an end (e.g., end of a lower side) of the shaft 26 to the display unit 13; a second fixing portion 28 made of a metal and attaching an another end (e.g., end of an upper side) of the shaft 26 to the display unit 13; a moving portion 31 made of a metal, attached to the shaft 26, and movable along the shaft 26; a first portion 32 made of a metal and attached to the main unit 12 by a fixing member such as a screw; and a second portion 33 made of a metal and attached to the moving portion 31 by a fixing member such as a screw. In the first portion 32, an attaching shaft 49 configured to attach an insertion member 44 is provided. The second portion 33 is connected to the first portion 32 and is configured to rotate with respect to the first portion 32. A resistance applying portion 50 configured by a plurality of disc springs is provided between the first portion 32 and the second portion 33. The display unit 13 is held at a desired angle by a resistance force of the resistance applying portion 50.

A circular recess 34 is provided on a surface of the first fixing portion 27 facing the shaft 26. The recess 34 is an example of a first engaging portion at the display unit 13 (i.e., second unit). A latch body 36 of a latch 35 to be described below is inserted into the recess 34, such that the latch 35 can be engaged with the recess 34.

As illustrated in FIG. 4, the moving portion 31 is attached to the main unit 12 side via the first portion 32 and the second portion 33.

As illustrated in FIGS. 2 and 5 to 7, the hinge unit 14 further includes: a bearing 37 provided inside the moving portion 31 and made of, for example, a resin (e.g., polyacetal resin (POM)); a hollow portion 38 (i.e., second recess) provided in the moving portion 31; a pair of edge portions 41 provided in the first fixing portion 27 in order to be positioned around the hollow portion 38; the latch 35 movable move with respect to the moving portion 31 in the hollow portion 38 (i.e., configured to move in a direction closer to the shaft 26 or in a direction away from the shaft 26, or configured to move forward or backward in the vicinity of the moving portion 31); a latch holder 42 provided over both edges 41 and holding the latch 35 within the hollow portion 38 in a movable state; a hole 43 passing through the second portion 33 and the moving portion 31; and an insertion member 44 configured to rotate around the attaching shaft 49 of the first portion 32 and configured to be inserted into the hole 43. A gap 45, into which the insertion member 44 is inserted, is provided between the latch 35 and a bottom of the hollow portion 38.

Figure 8:
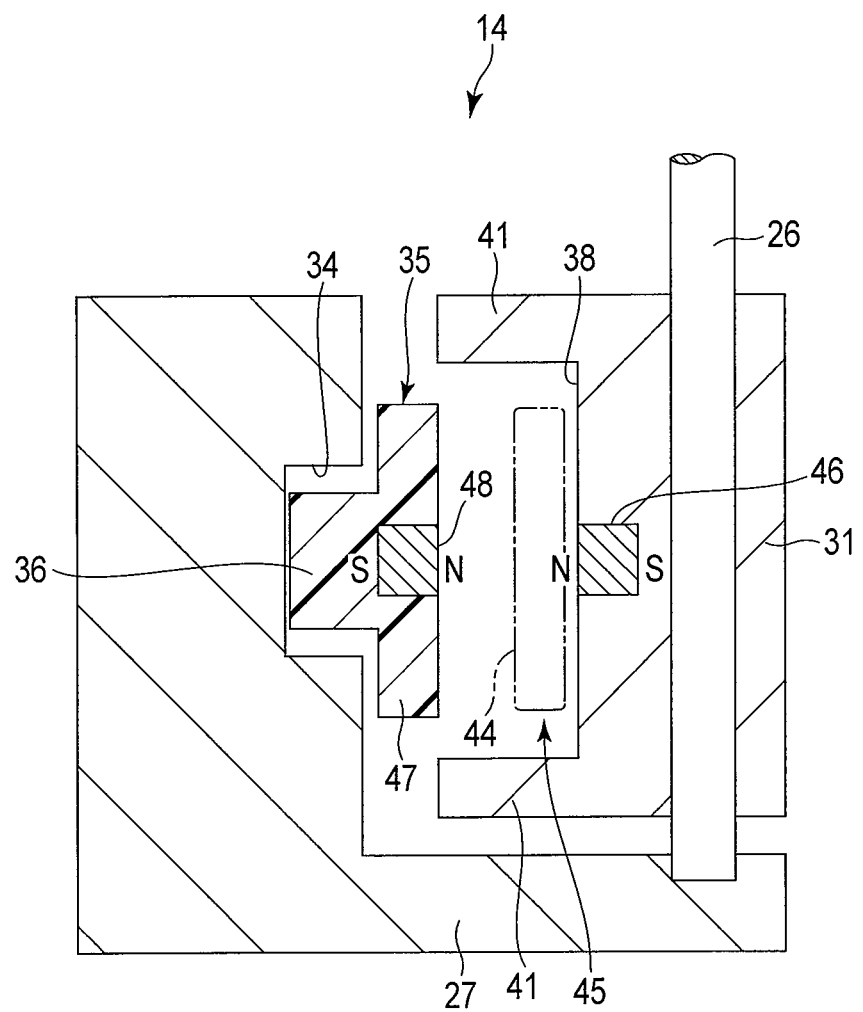
FIG. 8 is an exemplary sectional view taken along line F8-F8 of FIG. 4 and a sectional view schematically illustrating the first fixing portion, a recess, the moving portion, and the latch engaged with the recess in the hinge unit.

The moving portion 31 includes a first magnet 46 at a position facing the shaft 26. As illustrated in FIG. 8, for example, the first magnet 46 is provided such that an N pole faces the latch side and an S pole faces an opposite side (i.e., shaft side).

The latch 35 is an example of a second engaging portion capable of restricting a movement of the moving portion 31 when engaged with the recess 34 (i.e., first engaging portion). The latch 35 is integrally molded by, for example, a synthetic resin material such as a polyacetal resin (POM). The latch 35 includes: a cylindrical latch body 36; a plate-shaped portion 47 provided in a base side of the latch body 36 and preventing the latch body 36 from being released from the latch holder 42; and a second magnet 48 provided at a position of the plate-shaped portion 47 facing the moving portion 31. Also, a through-hole 42A configured to pass through the latch body 36 is provided in the latch holder 42 (see FIG. 7).

As illustrated in FIG. 8, for example, the second magnet 48 is provided such that an N pole faces the moving portion 31 side and an S pole faces a side opposite to the moving portion 31 (i.e., first fixing portion 27 side or latch body 36 side). Therefore, the second magnet 48 is disposed in a direction repulsive against the first magnet 46. Also, the directions of the first magnet 46 and the second magnet 48 are exemplary, and the directions may be reversed as long as the directions make the second magnet 48 repulsive against the first magnet 46 (e.g., the S poles face each other).

Figure 5:
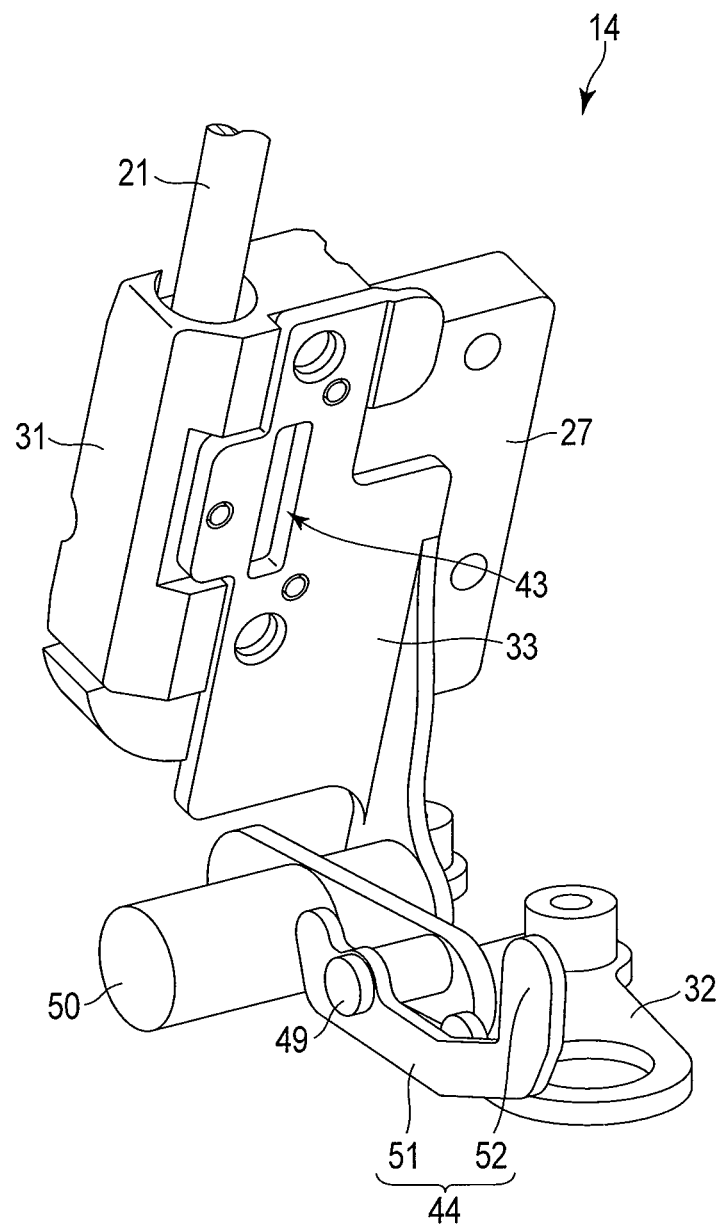
FIG. 5 is an exemplary perspective view illustrating a state of the hinge unit when the portable computer is in a state illustrated in FIG. 1.
Figure 6:
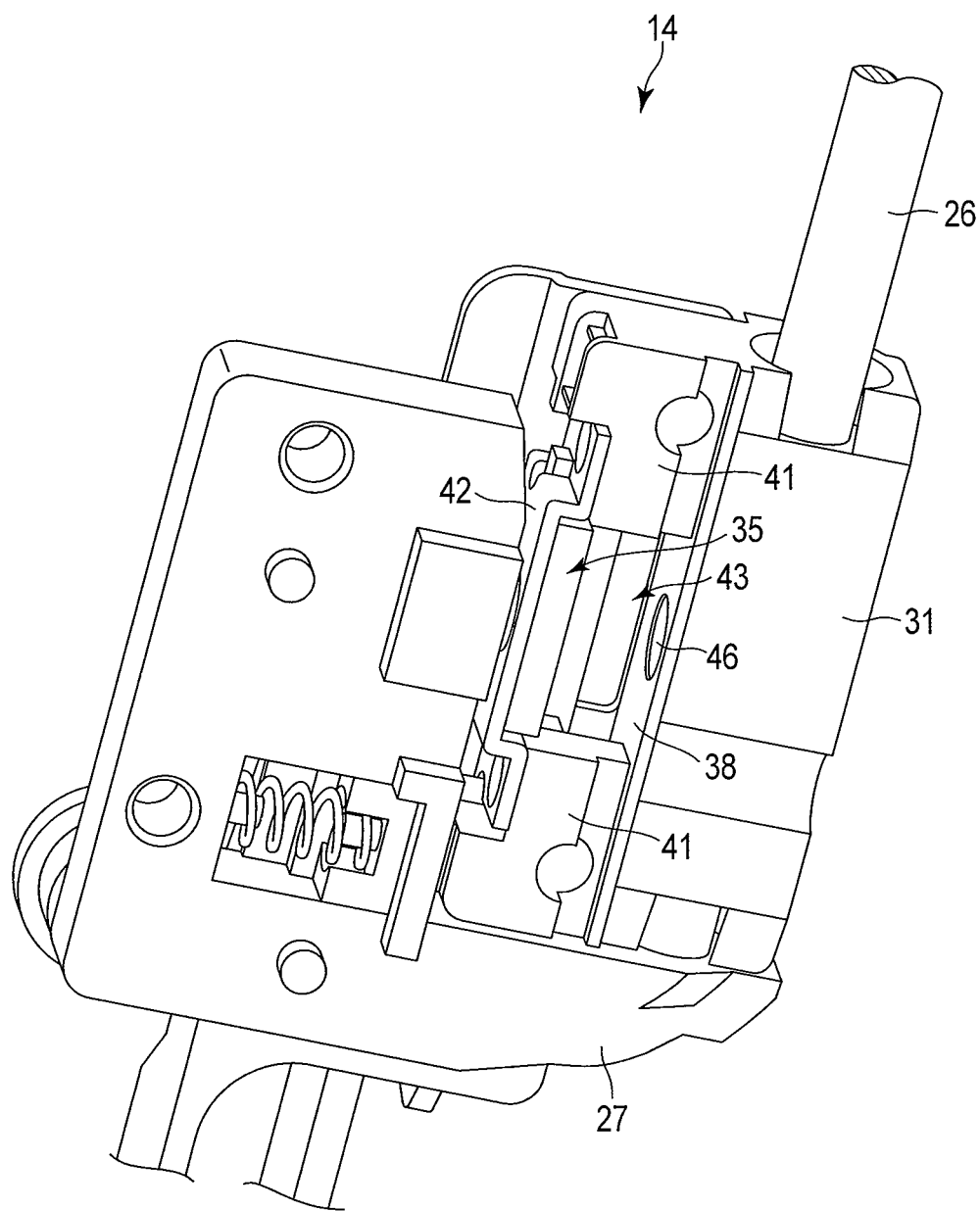
FIG. 6 is an exemplary enlarged perspective view illustrating a first fixing portion, a moving portion, and a latch of the hinge unit illustrated in FIG. 5.
Figure 7:
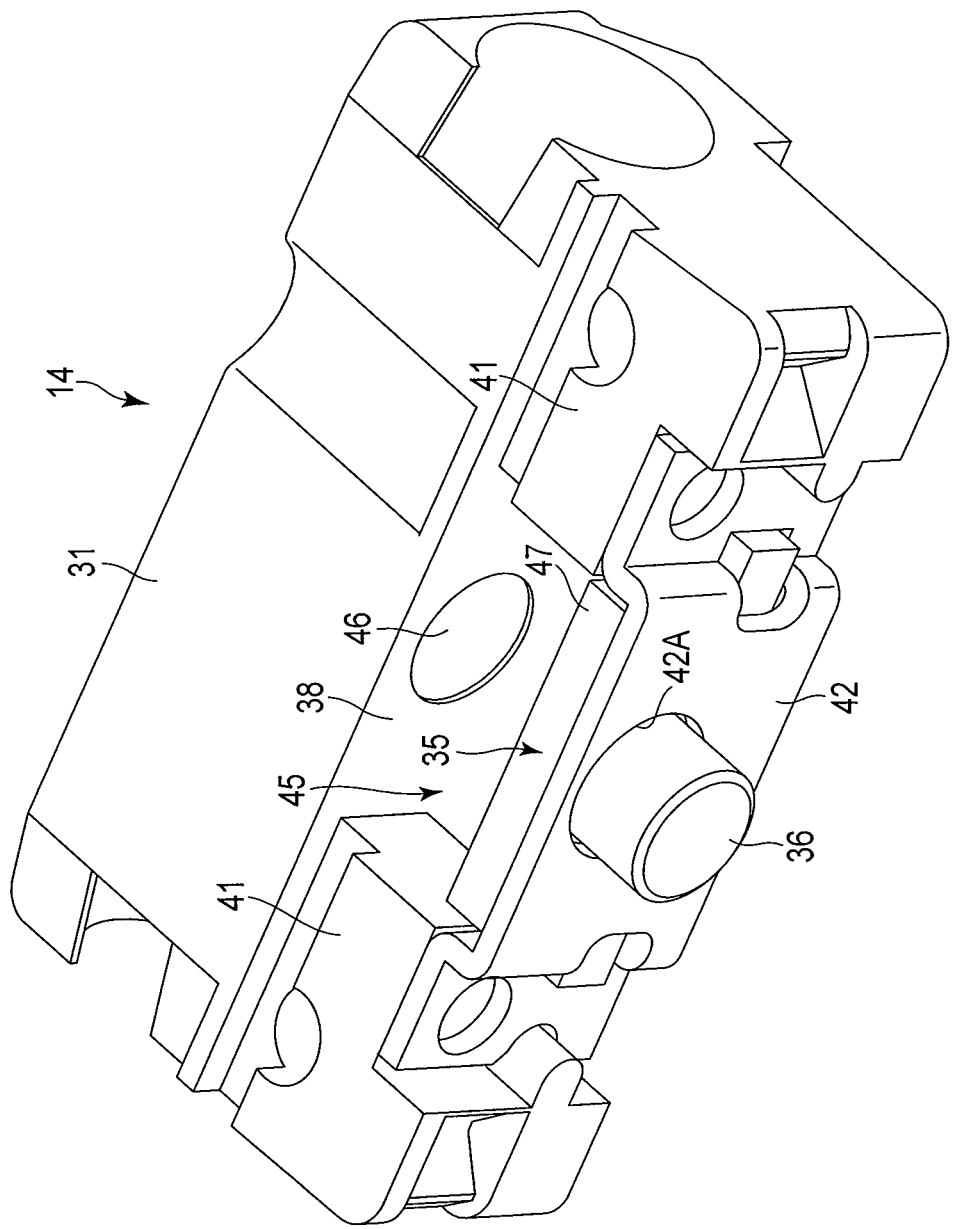
FIG. 7 is an exemplary enlarged perspective view illustrating the moving portion and the latch of the hinge unit illustrated in FIG. 6 at a different angle.

As illustrated in FIGS. 4 and 5, the insertion member 44 is an example of a metal member. For example, the insertion member 44 is made of a metal (e.g., an iron, a carbon steel, or the like) of a ferromagnetic body (i.e., sticking to the magnet or high permeability). The insertion member 44 is rotatably attached to the attaching shaft 49. The insertion member 44 includes a support portion 51 extending from a vicinity of a leading end of the attaching shaft 49 in a rod shape, and a stop portion 52 (e.g., a claw portion) protruding from a leading end of the support portion 51 in a direction intersecting with the support portion 51. Since a leading end of the stop portion 52 is rounded as a whole, the leading end of the stop portion 52 can be smoothly inserted and removed from the hole 43.

As will be described below, as the display unit 13 moves between a first position P1 illustrated in FIG. 1 and a second position P2 illustrated in FIG. 10, the insertion member 44 can be located between the first magnet 46 and the second magnet 48, or can be deviated from an area between the first magnet 46 and the second magnet 48.

As illustrated in FIG. 4, as the insertion member 44 rotates around the attaching shaft 49, the insertion member 44 can move between a position protruding from the main unit 12 and a position accommodated in the main unit 12.

Subsequently, the operation of the portable computer 11 of the present embodiment will be described with reference to FIGS. 1 and 5 to 14.

When the display unit 13 is in a state illustrated in FIG. 1 (i.e., first position P1), the hinge unit 14 is in a state illustrated in FIG. 5. In this state, the latch 35 is in a state illustrated in FIGS. 6 and 7, and the latch body 36 of the latch 35 is engaged with (e.g., inserted into) the recess 34 (i.e., first engaging portion) of the first fixing portion 27. In this state, the moving portion 31 does not move with respect to the shaft 26.

Figure 12:
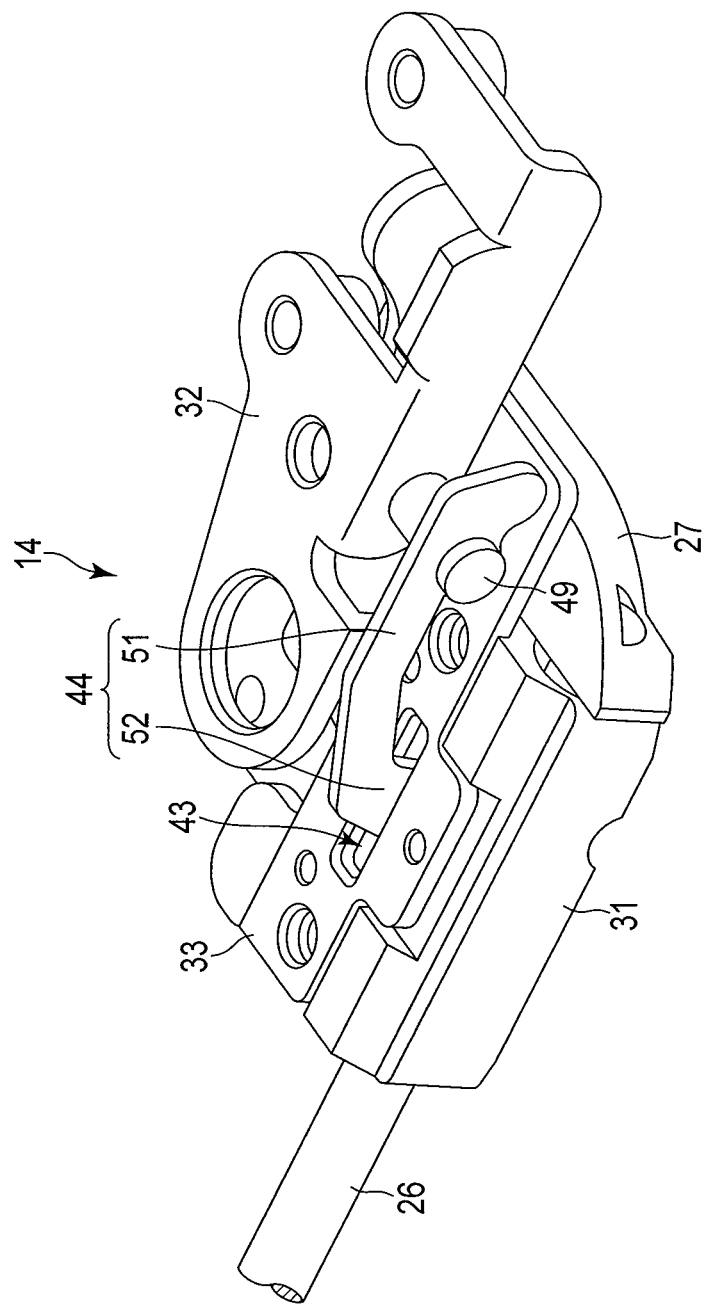
FIG. 12 is an exemplary perspective view illustrating the hinge unit of FIG. 11 from the perspective of a certain direction of the main unit.

When the display unit 13 is made to change from the state illustrated in FIG. 1 to the state illustrated in FIG. 10 (i.e., second position) by a user's hand, the insertion member 44 is inserted into the hole 43 and becomes a state illustrated in FIGS. 11 and 12. In this state (i.e., second position P2), the insertion member 44 is located between the first magnet 46 and the second magnet 48.

Figure 9:
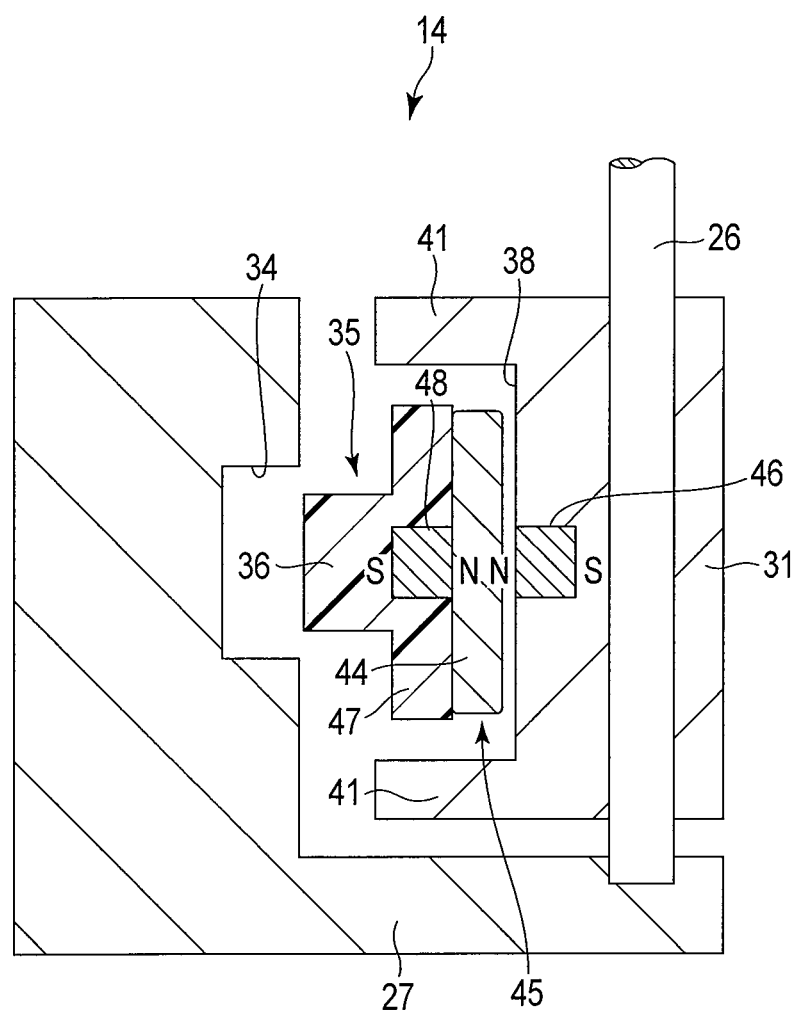
FIG. 9 is an exemplary sectional view schematically illustrating the first fixing portion, the recess, the moving portion, an insertion member, and the latch released from the recess and attracted on the insertion member in the hinge unit illustrated in FIG. 8.

When the insertion member 44 is located between the first magnet 46 and the second magnet 48, a state illustrated in FIG. 8 in which the latch 35 is engaged with the recess 34 is changed to a state illustrated in FIG. 9 in which the engagement of the latch 35 is released from the recess 34. That is, in the state illustrated in FIG. 8, a magnetic field acting repulsively between the first magnet 46 and the second magnet 48 is generated. However, due to the insertion of the insertion member 44 being a high permeability material, a magnetic field of the first magnet 46 is absorbed into the insertion member 44, resulting in a formation of a magnetic shield. Therefore, the repulsive force does not act between the first magnet 46 and the second magnet 48, or the repulsive force is weakened. Due to an attractive force of the second magnet 48, the latch 35 is attracted on the insertion member 44.

When the engagement of the latch 35 with respect to the recess 34 is released, the moving portion 31 and the display unit 13 can move along the shaft 26. In this state, the display unit 13 is moved from a state illustrated in FIG. 10 to a state illustrated in FIG. 13 in a sliding manner. In this manner, the portable computer 11 may become a tablet form.

Figure 14:
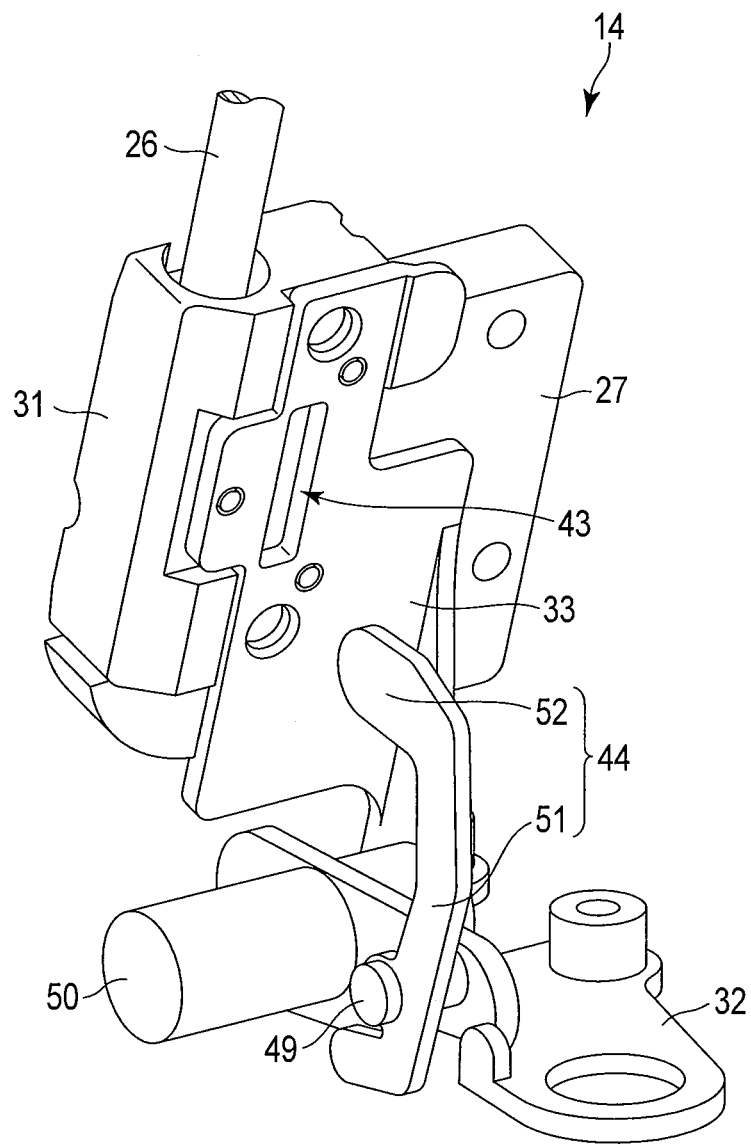
FIG. 14 is an exemplary perspective view illustrating a state in which the insertion member is released from a hole when the portable computer being in a state illustrated in FIG. 10 becomes a state illustrated in FIG. 1.

On the other hand, when the display unit 13 is returned from the tablet form to the standing state, the display unit 13 is moved to a position illustrated in FIG. 10 by a user's hand. Then, the display unit 13 is made to stand up to a position illustrated in FIG. 1 by a user's hand. At this time, as illustrated in FIG. 14, the insertion member 44 is released (i.e., removed) from the hole 43 and is dropped down to a position illustrated in FIG. 5 by a weight of the insertion member 44. Therefore, the repulsive force between the first magnet 46 and the second magnet 48 is restored, and the latch 35 becomes a state of being engaged with the recess 34 as illustrated in FIG. 8. Due to this engagement, the movement of the moving portion 31 along the shaft 26 is restricted. Thus, in a state in which the display unit 13 stands up, the moving portion 31 and the display unit 13 are not moved.

In accordance with the first embodiment, the portable computer 11 includes: a first unit; a second unit movable with respect to the first unit; a shaft 26 attached to the second unit; a first engaging portion attached to the second unit; a moving portion 31 attached to the first unit and movable along the shaft 26; a second engaging portion movable in a vicinity of the moving portion 31 and configured to restrict a movement of the moving portion 31 when the second engaging portion is engaged with the first engaging portion; a first magnet 46 provided at the moving portion 31; a second magnet 48 provided at the second engaging portion and configured to act repulsively against the first magnet 46; and a metal member configured to be detachable between the first magnet 46 and the second magnet 48 and to release engagement between the first engaging portion and the second engaging portion by attracting the second engaging portion when the metal member is inserted between the first magnet 46 and the second magnet 48.

In accordance with this configuration, a structure of restricting the movement of the moving portion 31 can be realized by a simple structure using two magnets. That is, when the second engaging portion is engaged with the first engaging portion, the movement of the moving portion 31 and the second unit (i.e., relative movement of the second unit with respect to the first unit) is restricted. On the other hand, when the metal member is located between the first magnet 46 and the second magnet 48, a magnetic field of the first magnet 46 is reduced by the metal member, and the second engaging portion is attracted to the metal member by an attractive force of the second magnet 48. Therefore, the movement of the second unit is enabled by releasing the engagement of the second engaging portion with respect to the first engaging portion. As described above, the second unit can be moved when needed by a user, and it is possible to prevent a problem that the moving portion 31 and the second unit move when not intended.

The metal member can be moved between a position protruding from the first unit and a position accommodated in the first unit. In accordance with this configuration, even when the installation of the structure such as the metal member might cause a finger, a cloth, or a clothing to be caught on the metal member, the metal member can be moved and accommodated in the first unit. Therefore, such a problem can be prevented.

The second unit can be moved between the first position P1 in which the second unit stands up with respect to the first unit, and the second position P2 in which the second unit is along the first unit. When the second unit is located in the second position P2, the metal member is located between the first magnet 46 and the second magnet 48.

In accordance with this configuration, when the second unit is located at the second position P2, the second unit can be relatively moved. In this manner, the second unit can be overlapped on the first unit.

Subsequently, a second embodiment of the electronic apparatus will be described with reference to FIGS. 15 to 17. A portable computer 11, which is an example of the electronic apparatus of the second embodiment, is different from the portable computer of the first embodiment in that a latch 35 and a latch holder 42 are provided in a first fixing portion 27 and a recess 34 is provided in a moving portion 31 side, but the other portions are common to the first embodiment. Therefore, parts different from the first embodiment will be mainly described, and the illumination or description of common parts will be omitted.

As illustrated in FIGS. 15 and 16, a hinge unit 14 includes: a shaft 26 made of a metal; a first fixing portion 27 made of a metal and attaching an end (e.g., end of a lower side) of the shaft 26 to a display unit 13; a second fixing portion 28 (see FIG. 3) made of a metal and attaching an another end (e.g., end of an upper side) of the shaft 26 to the display unit 13; a moving portion 31 made of a metal, attached to the shaft 26, and movable along the shaft 26; a first portion 32 (see FIG. 4)

made of a metal and attached to a main unit 12 by a fixing member such as a screw; and a second portion 33 (see FIG. 4) made of a metal and attached to the moving portion 31 by a fixing member such as a screw.

A recess 34 is provided on a surface of the moving portion 31 facing the first fixing portion 27. The recess 34 is an example of a first engaging portion. A latch body 36 of a latch 35 to be described below is inserted into the recess 34, such that the latch 35 can be engaged with the recess 34.

The hinge unit 14 includes: a hollow portion 38 (i.e., second recess) provided in the first fixing portion 27; a pair of edge portions 41 provided in the first fixing portion 27 in order to be positioned around the hollow portion 38; a groove portion 61 continued with the hollow portion 38; the latch 35 movable with respect to the first fixing portion 27 in the hollow portion 38 (i.e., configured to move in a direction closer to the shaft 26 or in a direction away from the shaft 26); a latch holder 42 provided over both edges 41 and holding the latch 35 within the hollow portion 38 in a movable state; a hole 43 passing through the second portion 33 and the first fixing portion 27; and an insertion member 44 configured to rotate with respect to the first portion 32 and configured to be inserted into the hole 43.

The groove portion 61 is recessed from a surface of the first fixing portion 27 facing the main unit 12. A gap 45, into which an insertion member 44 is inserted, is provided between the latch 35 and a bottom of the hollow portion 38.

The first fixing portion 27 includes a first magnet 46 at a position facing the shaft 26. As illustrated in FIG. 16, for example, the first magnet 46 is provided such that an N pole faces the latch side and an S pole faces a side opposite to the latch 35.

The latch 35 is an example of a second engaging portion. The latch 35 is integrally molded by, for example, a synthetic resin material such as a polyacetal resin (POM). The latch 35 includes: a cylindrical latch body 36; a plate-shaped portion 47 provided in a base side of the latch body 36 and preventing the latch body 36 from being released from the latch holder 42; and a second magnet 48 provided at a position of the plate-shaped portion 47 facing the first fixing portion 27.

As illustrated in FIG. 16, for example, the second magnet 48 is provided such that an N pole faces the first fixing portion 27 side and an S pole faces a side opposite to the first fixing portion 27 (i.e., moving portion 31 side or latch body 36 side). A structure of the insertion member 44 is substantially identical to the first embodiment.

Subsequently, the operation of the portable computer 11 of the present embodiment will be described with reference to FIGS. 1, 5, 10 and 13 to 17.

When the display unit 13 is in a state illustrated in FIG. 1, the hinge unit 14 is in a state illustrated in FIG. 16. In this state, the latch body 36 of the latch 35 is engaged with (e.g., inserted into) the first engaging portion of the moving portion 31. In this state, the moving portion 31 does not move with respect to the shaft 26.

Figure 17:
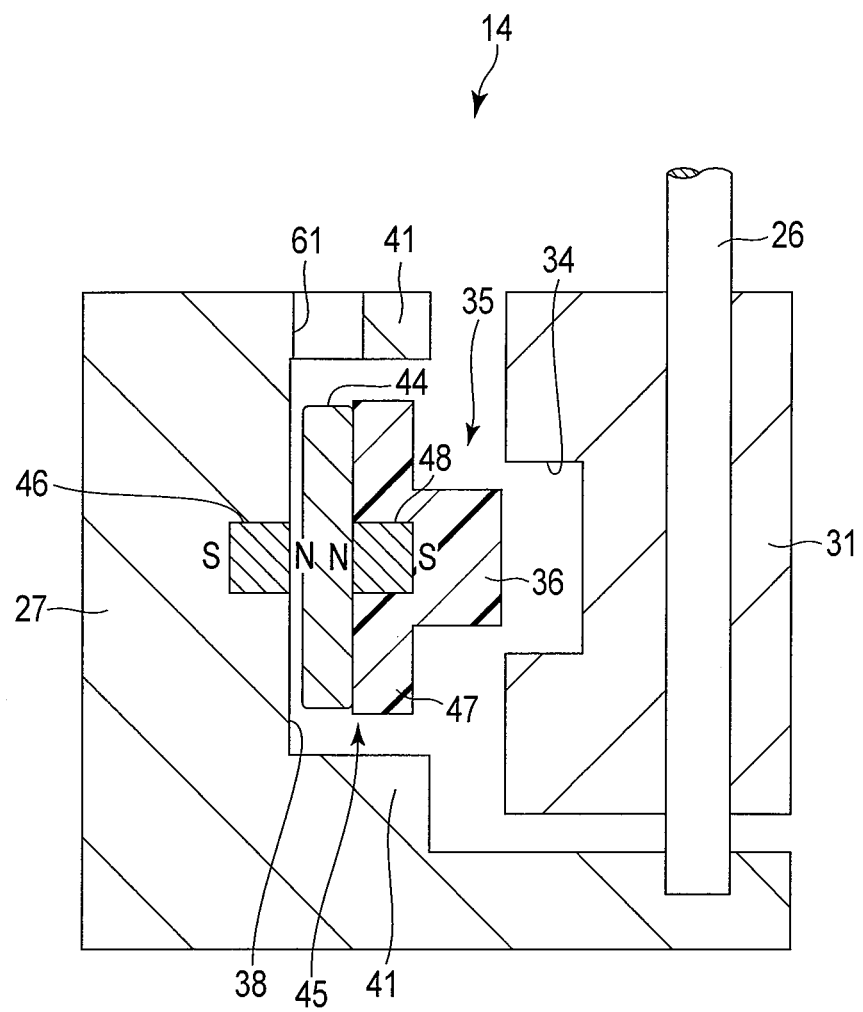
FIG. 17 is an exemplary plan view schematically illustrating the first fixing portion, the recess, the moving portion, the insertion member, and the latch released from the recess and attracted on the insertion member in the hinge unit illustrated in FIG. 17.

When the display unit 13 is made to change from the state illustrated in FIG. 1 to the state illustrated in FIG. 10 by a user's hand, the insertion member 44 is inserted into the hole 43 and becomes a state illustrated in FIG. 17. In this state, the insertion member 44 is located between the first magnet 46 and the second magnet 48.

When the insertion member 44 is located between the first magnet 46 and the second magnet 48, a state illustrated in FIG. 16 in which the latch 35 is engaged with the recess 34 is changed to a state illustrated in FIG. 17 in which the engagement of the latch 35 is released from the recess 34. An operation principle of the latch 35 is substantially identical to the first embodiment.

When the engagement of the latch 35 with respect to the recess 34 is released, the moving portion 31 and the display unit 13 can move along the shaft 26. At this time, since the insertion member 44 can move inside and outside of the recess 34 through the groove portion 61 as illustrated in FIG. 15, the insertion member 44 is not caught to the first fixing portion 27. In this state, the display unit 13 moves from a state illustrated in FIG. 10 to a state illustrated in FIG. 13 in a sliding manner by a user's hand. In this manner, the portable computer 11 may become a tablet form.

On the other hand, when the display unit 13 is returned from the tablet form to the standing state, the display unit 13 is moved to a position illustrated in FIG. 10 by a user's hand. Then, the display unit 13 is made to stand up to a position illustrated in FIG. 1 by a user's hand. At this time, as illustrated in FIG. 14, the insertion member 44 is released from the hole 43 and is dropped down to a position illustrated in FIG. 5 by a weight of the insertion member 44. Therefore, the repulsive force between the first magnet 46 and the second magnet 48 is restored, and the latch 35 becomes a state of being engaged with the recess 34. In this manner, the movement of the moving portion 31 along the shaft 26 is restricted. Thus, in a state in which the display unit 13 stands up, the moving portion 31 and the display unit 13 are not moved.

In accordance with the second embodiment, the portable computer 11 includes: a first unit; a second unit movable with respect to the first unit; a shaft 26 attached to the second unit; a fixing portion attaching an end of the shaft 26 to the second unit; a moving portion 31 attached to the first unit, movable along the shaft 26, and comprising a first engaging portion; a second engaging portion movable in a vicinity of the fixing portion and to restrict a movement of the moving portion 31 when the second engaging portion is engaged with the first engaging portion; a first magnet 46 provided at the fixing portion; a second magnet 48 provided at the second engaging portion and configured to act repulsively against the first magnet; and a metal member configured to release engagement between the first engaging portion and the second engaging portion by attracting the second engaging portion when the metal member is inserted between the first magnet 46 and the second magnet 48.

In accordance with this configuration, a structure of restricting the movement of the moving portion 31 can be realized by a simple structure using two magnets. Therefore, the second unit can be moved when needed by a user, and it is possible to prevent a problem that the moving portion 31 and the second unit move when not intended.

Also, the electronic apparatus are not limited to the above-described embodiments as they are, and may be specified by modifying components without departing from the gist of the invention in the practice steps. Moreover, various inventions can be made by an appropriate combination of the plurality of components disclosed in the embodiments. For example, some components may be eliminated from the entire components provided in the embodiments. Moreover, components of different embodiments may be appropriately combined with one another.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a first unit;
a second unit movable with respect to the first unit;
a shaft attached to the second unit;
a first engaging portion attached to the second unit;
a moving portion attached to the first unit and movable along the shaft;
a second engaging portion movable in a vicinity of the moving portion and configured to restrict a movement of the moving portion when the second engaging portion is engaged with the first engaging portion;
a first magnet at the moving portion;
a second magnet at the second engaging portion, the second magnet configured to act repulsively against the first magnet; and
a metal member configured to be detachable between the first magnet and the second magnet and to release engagement between the first engaging portion and the second engaging portion by attracting the second engaging portion when the metal member is inserted between the first magnet and the second magnet.

2. The electronic apparatus of claim 1, wherein
the metal member is movable between a position protruding from the first unit and a position accommodated in the first unit.

3. The electronic apparatus of claim 2, wherein
the second unit is movable between a first position in which the second unit stands up with respect to the first unit, and a second position in which the second unit is along the first unit, and
the metal member is located between the first magnet and the second magnet when the second unit is in the second position.

4. An electronic apparatus comprising:
a first unit;
a second unit movable with respect to the first unit;
a shaft attached to the second unit;
a fixing portion attaching an end of the shaft to the second unit;
a moving portion attached to the first unit, movable along the shaft, and comprising a first engaging portion;
a second engaging portion movable in a vicinity of the fixing portion and to restrict a movement of the moving portion when the second engaging portion is engaged with the first engaging portion;
a first magnet at the fixing portion;
a second magnet at the second engaging portion, the second magnet configured to act repulsively against the first magnet; and
a metal member configured to be detachable between the first magnet and the second magnet and to release engagement between the first engaging portion and the second engaging portion by attracting the second engaging portion when the metal member is inserted between the first magnet and the second magnet.

5. The electronic apparatus of claim 4, wherein
the metal member is movable between a position protruding from the first unit and a position accommodated in the first unit.

6. The electronic apparatus of claim 5, wherein
the second unit is movable between a first position in which the second unit stands up with respect to the first unit, and a second position in which the second unit is along the first unit, and
the metal member is located between the first magnet and the second magnet when the second unit is in the second position.

7. An electronic apparatus comprising:
a first unit;
a second unit movable with respect to the first unit;
a shaft attached to the second unit;
a fixing portion attached to the second unit and comprising a first engaging portion;
a moving portion attached to the first unit and movable along the shaft;
a second engaging portion movable in a vicinity of the moving portion and configured to restrict a movement of the moving portion when the second engaging portion is engaged with the first engaging portion;
a first magnet at the moving portion;
a second magnet at the second engaging portion, the second magnet configured to act repulsively against the first magnet; and
a metal member configured to be located between the first magnet and the second magnet or to be away from an area between the first magnet and the second magnet, and to attract the second engaging portion by a magnetic force of the second magnet in order to release engagement between the first engaging portion and the second engaging portion when the metal member is located between the first magnet and the second magnet.

* * * * *